United States Patent [19]

Van Doorn et al.

[11] Patent Number: 5,736,847
[45] Date of Patent: Apr. 7, 1998

[54] POWER METER FOR DETERMINING PARAMETERS OF MULIPHASE POWER LINES

[75] Inventors: Peter M. Van Doorn, Sidney; Simon H. Lightbody; Chuen Shan Simon Ki, both of Victoria, all of Canada

[73] Assignee: CD Power Measurement Limited, Victoria, Canada

[21] Appl. No.: 367,534

[22] Filed: Dec. 30, 1994

[51] Int. Cl.$^6$ ............................................. G01R 21/133
[52] U.S. Cl. ............................................. 324/142; 364/483
[58] Field of Search ................... 324/103 R, 107, 324/142, 141, 74; 364/481, 483, 572

[56] References Cited

U.S. PATENT DOCUMENTS

| | | |
|---|---|---|
| Re. 31,774 | 12/1984 | Fletcher et al. |
| 4,077,061 | 2/1978 | Johnston et al. |
| 4,156,280 | 5/1979 | Griess |
| 4,240,149 | 12/1980 | Fletcher et al. |
| 4,345,311 | 8/1982 | Fielden .................. 364/483 |
| 4,365,302 | 12/1982 | Elms ..................... 364/483 |
| 4,388,611 | 6/1983 | Haferd |
| 4,455,612 | 6/1984 | Girgis et al. |
| 4,459,546 | 7/1984 | Arrington et al. |
| 4,463,311 | 7/1984 | Kobayashi |
| 4,568,934 | 2/1986 | Allgood |
| 4,612,617 | 9/1986 | Laplace, Jr. et al. |
| 4,642,564 | 2/1987 | Hurley .................. 324/132 |
| 4,663,587 | 5/1987 | Mackenzie |
| 4,672,555 | 6/1987 | Hart et al. |
| 4,715,000 | 12/1987 | Premerlani ............. 364/484 |
| 4,783,748 | 11/1988 | Swarztrauber et al. ... 364/483 |
| 4,794,369 | 12/1988 | Haferd |
| 4,837,504 | 6/1989 | Baer et al. ............. 324/142 |
| 4,839,819 | 6/1989 | Begin et al. |
| 4,878,142 | 10/1989 | Bergman et al. |
| 4,878,185 | 10/1989 | Brand et al. |
| 4,884,021 | 11/1989 | Hammond et al. ...... 324/142 |
| 4,901,221 | 2/1990 | Kodosky et al. |
| 4,914,568 | 4/1990 | Kodosky et al. |
| 4,979,122 | 12/1990 | Davis et al. |
| 5,017,860 | 5/1991 | Germer et al. |
| 5,059,896 | 10/1991 | Germer et al. |
| 5,061,890 | 10/1991 | Langini ................. 324/107 |
| 5,081,413 | 1/1992 | Yamada et al. |
| 5,122,735 | 6/1992 | Porter et al. ........... 324/142 |
| 5,132,610 | 7/1992 | Ying-chang |
| 5,151,866 | 9/1992 | Glaser et al. .......... 364/487 |
| 5,155,836 | 10/1992 | Jordan et al. |
| 5,212,441 | 5/1993 | McEachern et al. ..... 324/142 |
| 5,224,011 | 6/1993 | Yalla et al. ............ 361/93 |
| 5,224,054 | 6/1993 | Wallis .................. 364/483 |
| 5,233,538 | 8/1993 | Wallis .................. 364/483 |
| 5,243,536 | 9/1993 | Bradford .............. 364/483 |
| 5,243,537 | 9/1993 | Neumann |
| 5,245,275 | 9/1993 | Germer et al. |
| 5,247,454 | 9/1993 | Farrington et al. |
| 5,258,704 | 11/1993 | Germer et al. |
| 5,262,715 | 11/1993 | King et al. |
| 5,270,640 | 12/1993 | Kohler et al. |
| 5,301,121 | 4/1994 | Garverich et al. ..... 364/572 |
| 5,391,983 | 2/1995 | Lusigman et al. ..... 364/483 |
| 5,414,812 | 5/1995 | Filip et al. |
| 5,426,780 | 6/1995 | Gerull et al. |
| 5,481,700 | 1/1996 | Thuraisingham |
| 5,498,956 | 3/1996 | Kinney et al. |

*Primary Examiner*—Vinh P. Nguyen
*Attorney, Agent, or Firm*—Brinks Hofer Gilson & Lione

[57] ABSTRACT

A power meter is disclosed for determining power parameters for power lines having periodic 3-phase voltage and current signals distributed to a plurality of power equipment. The 3-phase voltage and current signals have a fundamental frequency. The power lines are connected to at least one transducer which generates analog signals representing the voltage and current signals. The power meter includes receiving circuitry which can be connected to the at least one transducer to receive the analog signals. An analog to digital converter receives the output signal from the receiving circuitry and converts the voltage and current signals to digital data representing the analog signals. A processor receives the digital data and includes logic for calculating the power parameters. The power meter compensates for errors caused by not sampling synchronous to the fundamental frequency of the signals.

22 Claims, 5 Drawing Sheets

MULTI-POINT CALIBRATION

START
↓
GIVEN I CALCULATE f(I)
↓
MULTIPLY RAW SIGNAL BY f(I) TO GET CALIBRATED SIGNAL
↓
DONE

FIG. 8

PHASE COMPENSATION
↓
CALCULATE kW AND kVAR
↓
CALCULATE kVA
$kVA = (kW^2 + kVAR^2)^{1/2}$
↓
CALCULATE $\beta$
$\beta = \cos^{-1}(kW/kVA)$
↓
CALCULATE $\phi$
$\phi = aI^2 + bI + c$
↓
CALCULATE $\theta$
$\theta = \beta - \phi$
↓
RECALCULATE kW AND kVAR
$kW = kVA \cos(\theta)$
$kVAR = kVA \sin(\theta)$

POWER METER FOR DETERMINING PARAMETERS OF MULIPHASE POWER LINES

This application is related to U.S. patent application Ser. No. 08/369,849, now Pat. No. 5,650,936 filed concurrently with this application and entitled "Power Monitor Apparatus And Method With Object Oriented Structure".

BACKGROUND OF THE INVENTION

The present invention relates generally to digital power monitoring. More specifically, the invention relates to a digital power monitoring system which provides the capability to monitor the quality of the power being transmitted through a power system.

Monitoring of electrical power, particularly the measuring and calculating of electrical parameters, provides valuable information for power utilities and their customers. Monitoring of electrical power is important to ensure that the electrical power is effectively and efficiently generated, distributed and utilized. As described in more detail below, knowledge about power parameters such as volts, amps, watts, phase relationship between waveforms, KWH, KVAR, KVARH, KVA, KVAH, power factor, frequency, etc. is of foremost concern for utilities and industrial power users.

Typically, electricity from a utility is fed from a primary substation over a distribution cable to several local substations. At the substations, the supply is transformed by distribution transformers from a relatively high voltage on the distributor cable to the lower voltage at which it is supplied to the end consumer. From the substations, the power is provided to industrial users over a distributed power network which supplies power to various loads. Such loads may be, for example, various power machines.

In such arrangements, utilities need to measure power coming out of or into the generating station or going into a power station. It is important to minimize the phase relationship between the current and voltage waveforms of the power being transmitted to minimize losses. It is also important to minimize the amount of harmonics that are present in the voltage and current waveforms. Also, the ability to detect the presence and magnitude of faults in the power system is important. Thus, accurate measurement of these waveforms is important.

In industrial applications, it is important to continuously monitor the voltage, current, phase, harmonics, faults and 3 phase balance of the power into the machine. These parameters may vary with the machine load. With knowledge of these parameters the industrial user can better adjust, and control the loads to control machines, determine alarm conditions and/or to more efficiently use the power.

Various different arrangements are presently available for monitoring, measuring, and controlling power parameters. Typically, an individual power measuring device which measures specific power system parameters is placed on a given branch or line proximate one of the loads. Such power monitoring devices measure electrical power parameters, such as those described above.

An example of such a system is disclosed in U.S. Pat. No. 5,151,866. In the system disclosed in this patent, a power analyzer system uses discrete analog transducers to convert AC voltage and current signals from a power system to DC output signals. The values from the voltage and the current transducers are then used to calculate the various other desired power parameters.

In addition to monitoring power parameters of a certain load, power monitoring devices have a variety of other applications. For example, power monitoring devices can be used in supervisory control and data acquisition systems (SCADA), process controllers, such as programmable logic controllers (PLC), etc.

Therefore, in view of the above, it is the primary objective of the present invention to provide a power monitoring device which can determine the quality of the power flowing within a power system.

It is a further object of the present invention to provide a power monitoring device with high accuracy.

It is still a further object of the present invention to provide a power monitoring device that contains modular components which can be replaced or interchanged.

SUMMARY OF THE INVENTION

To achieve these and other objectives, the present invention uses innovative hardware and software to monitor the status of the power system. A power meter is disclosed for determining power parameters for power lines having periodic 3-phase voltage and current signals distributed to a plurality of power equipment. The 3-phase voltage and current signals have a fundamental frequency. The power lines are connected to at least one transducer which generates analog signals representing the voltage and current signals. The power meter includes receiving circuitry which can be connected to the at least one transducer to receive the analog signals. An analog to digital converter receives the output signal from the receiving circuitry and converts the voltage and current signals to digital data representing the analog signals. A processor receives the digital data and includes logic for calculating the power parameters. The power meter includes means for compensating for errors caused by not sampling synchronous to the fundamental frequency of the signals.

In another aspect of the invention, means are used to sample the voltage and current signals in the power system as closely as possible to an integral number of times per line frequency cycle.

In another aspect of the invention, means are used to capture transient high current faults in the power system while still maintaining high accuracy when a fault is not present.

Many modifications to the preferred embodiment will be apparent to those skilled in the art. It is the intention of this description to provide an example system using the invention. It is not the intention of this description to limit the scope of the invention.

DETAILED DESCRIPTION OF THE PRESENTLY PREFERRED EMBODIMENTS

The present invention comprises a novel system and method for monitoring the electrical signals within a power system. The novel system is particularly suited to providing highly accurate measurements of these signals and providing means to detect problems within the power system.

Figure 1:
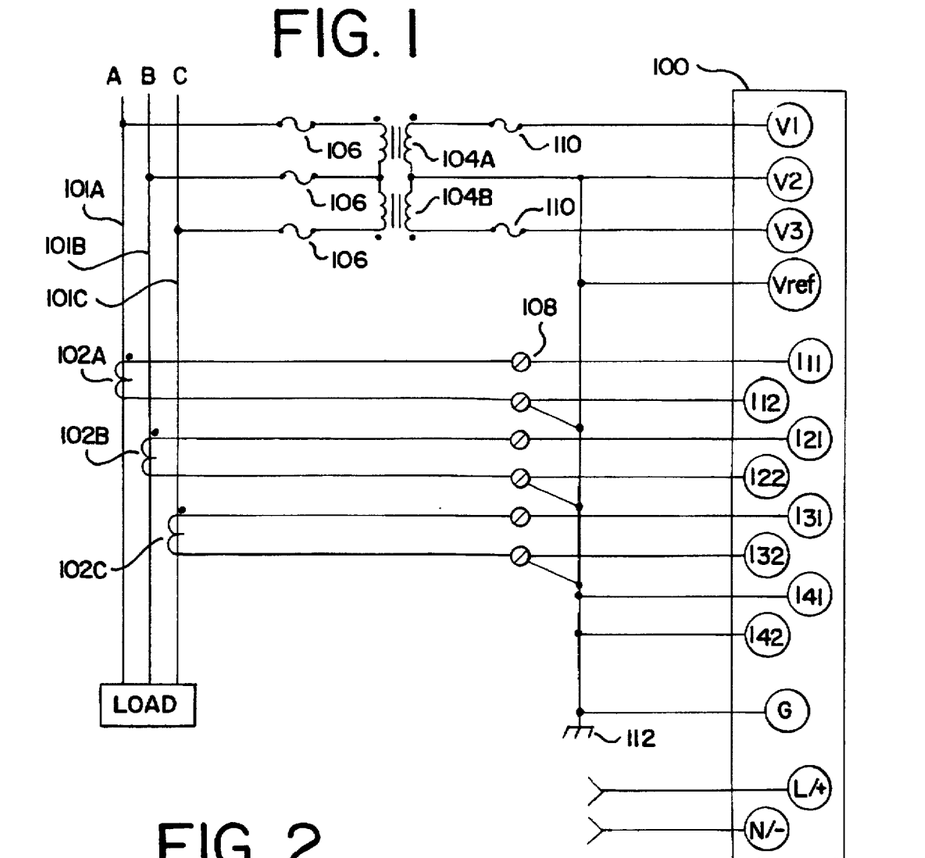
FIG. 1 schematically represents a preferred embodiment of a system using a power monitoring unit of the present invention.

FIG. 1 schematically illustrates how a power monitoring unit 100 using the present invention is connectable to a three wire power line. Three current transducers (CTs) 102A, 102B and 102C are connected to wires 101A, 101B and 101C of the power line, respectively. Potential transducers (PTs) 104A and 104B are connected between lines 101A, 101B and 101B, 101C, respectively. A plurality of fuses 106 are disposed between the lines 101A–101C and PTs 104A and 104B. Fuses 110 are connected between PTs 104A and 104B and unit 100.

The CTs 102A–102C are connected through a shorting switch or test block 108 to the power monitoring unit 100. The CTs 102A–102C provide the power monitoring unit 100 with current inputs I11–I32. The PTs 104A and 104B provide the power monitoring unit 100 with voltage inputs V1–V3. Current inputs I41 and I42, chassis ground 112 and voltage input VREF are connected to ground potential. The unit 100 is connected to a power supply, such as a standard 120V AC supply, through power leads L and N.

Figure 2:
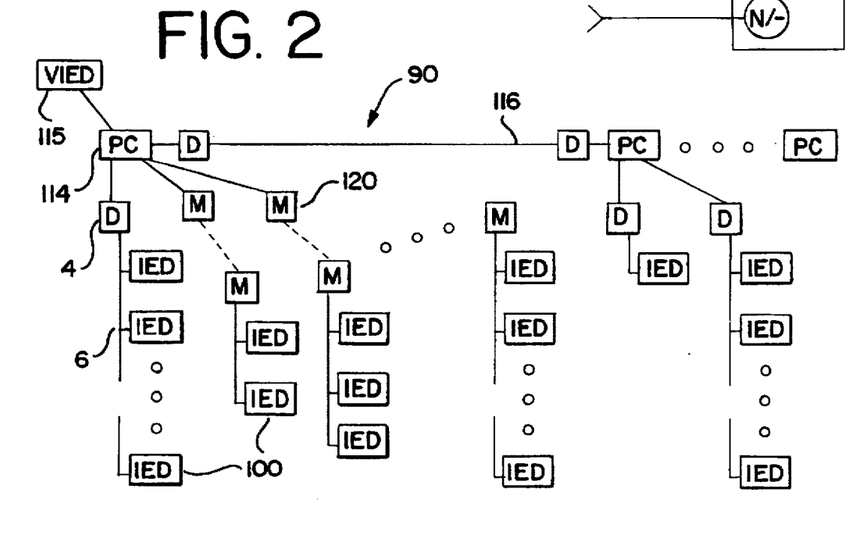
FIG. 2 schematically illustrates a physical layout of a preferred embodiment of a system of the present invention incorporating as components a plurality of power monitoring units such as shown in FIG. 1.

FIG. 2 shows a preferred embodiment of the physical layout of a plurality of monitoring units 100 in a system 90 using the present invention. The system comprises one or more personal computers (PCs) 114 which are used as master devices. A plurality of monitoring units 100 configured as intelligent electronic devices (IEDs) are used as slave devices. Virtual intelligent electronic devices (VIEDs) 115 which reside in software on the personal computer 114 can also serve as slave devices. All devices in the system are interconnected through a communication network 116. The network may be directly connected to devices or may connect through other communications devices such as modems 120.

Figure 3:
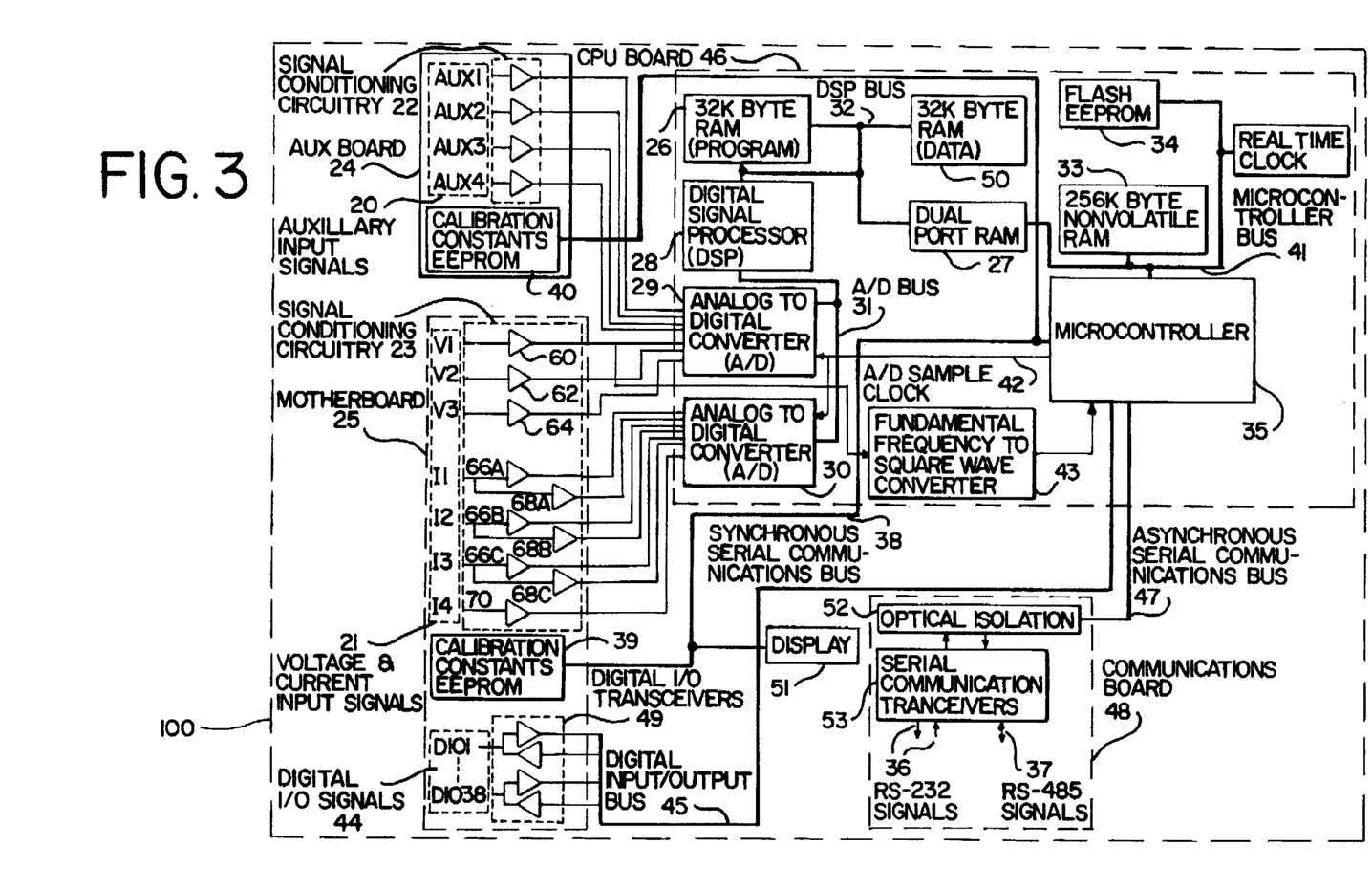
FIG. 3 schematically illustrates a preferred embodiment of the internal structure of a power monitoring unit as shown in FIG. 2.

Referring now to FIG. 3, a preferred embodiment of the internal structure of an IED 100 is illustrated. Three-phase voltage and current input signals VI–V3 and I1–I4 from electric power lines enter the motherboard 25 and are converted to voltage levels compatible with the analog to digital converters (A/Ds) 29 and 30 by signal conditioning circuitry 23. In an exemplary embodiment a suitable A/D converter is a 13 bit, 7 input one available from National Semiconductor as model No. LM12458CIV. A suitable voltage to the A/D's 29 and 30 ranges from 0 to 5 Volts depending on what part of the AC signal the sample is taken at.

In the illustrated embodiment, the signal conditioning circuitry comprises operational amplifiers (op amps) and associated circuitry 60, 62 and 64 which amplify V1, V2 and V3 respectively. The currents I1, I2, and I3 are amplified by two different scales to provide greater dynamic range. The amplification to the two different scales is implemented using the conditioning circuitry 23. Op amps 66A, 66B and 66C amplify input current signals I1, I2 and I3, respectively, to a first scale. For example, a current of 5 Amperes AC creates a voltage of 4 Volts AC to the A/D converter. Op amps 68A, 68B and 68C amplify input current signals I1, I2 and I3, respectively to a second scale. For example, a current of 100 Amperes AC creates a voltage of 4 Volts AC to the A/D converter. This arrangement permits the IED 100 to monitor current signals in the normal operating range (with a first scale) and out of normal range currents such as those experienced in transient conditions (with the second scale). The IED 100 includes program logic 88 comprising a means 82 to calculate power parameters and preferably the IED 100 includes logic 88 comprising a means 85 to calculate power parameters for signals in the normal operating range and means 86 to calculate power parameters for signals out of the normal operating range. The voltage and current signals enter separate A/Ds 29 and 30 so that the voltage and current on a particular phase can be simultaneously sampled.

Auxiliary input signals 20 on the AUX board 24 also pass through signal conditioning circuitry 22 and to A/D 29. Auxiliary inputs allow the user to sample additional signals in addition to the three-phase voltage and current. For example, the auxiliary inputs may be 0 to 10 Volts DC outputs from a temperature transducer.

A digital signal processor (DSP) 28 reads the samples from the A/D converters 29, 30 through the A/D Bus 31. The signals are preferably sampled at the rate of 128 samples per line frequency cycle. The DSP performs a Fast Fourier Transform (FFT) on the samples to determine the frequency components of the signal in a manner known in the art. It also calculates Root Mean Square (RMS) voltage and/or current for each input signal. This data is then transferred through dual port RAM 27 to the microcontroller 35. A suitable DSP is a TMS320C25 available from Texas Instruments.

The Microcontroller 35 performs many functions within the IED. The fundamental frequency to square wave converter 43 provides a square wave at the fundamental frequency of the incoming voltage signals. A suitable fundamental frequency to square wave converter consists of an LM311D available from National Semiconductor configured in a manner known in the art.

A time processing unit (TPU) within the microcontroller 35 measures this frequency. The TPU also provides the ability to create a signal at a desired frequency. This capability is used to create the sample clock for the A/D converters. Because the clock within the microcontroller has a fixed frequency (16.777 MHz), this sample clock has a fixed minimum resolution. The period of this clock can be adjusted to a value that has a resolution of 4 times the microcontroller's clock period, i.e. 238.4216 ns. A suitable microcontroller is the MC68332 available from Motorola.

Since the DSP is receiving samples from the A/D converters at very close to 128 samples per line frequency cycle, it can perform a Fast Fourier Transform (FFT) on any group of 128 consecutive cycles. The result of the FFT is a set of phasors indicating the magnitude and phase of the fundamental frequency of the signal plus the magnitude and phase of the first 63 harmonics. A more detailed description of this process is given below.

Different AUX boards 24 and motherboards 25 can be exchanged with different CPU Boards 46 by using the plugable AUX board 24 and motherboard 25. This, however presents a calibration problem and/or a configuration problem. In the system of the present invention, the calibration information and/or configuration information for the circuitry 22, 23 of each AUX or motherboard is preferably stored on the individual board. This is implemented by storing the calibration constants and/or configuration information in a memory device such as an EEPROM 39, 40 on each individual board. The microcontroller 35 then reads the information using the synchronous serial communications bus 38 before performing calculations on the values received through the dual port RAM 27 from the DSP 28.

The synchronous communications bus 38 is also used to communicate with the display 51. Results of all calculations and control functions of the microcontroller 35 can be displayed on the display 51. The display 51 provides graphical display capability which allows it to display bar graphs indicating the value of a parameter calculated by the microcontroller 35. The bar graphs can be updated at a rate of 10 times per second. This provides the user with the ability to see rapid changes in a measured parameter which would be undetectable to the human eye if the parameter value was displayed in numerical format. In addition, the display provides the ability to do the following: 1) display parameter values in text format; 2) graph the value of a parameter over time; 3) plot the spectrum of a given voltage or current input in graphical format in a similar fashion to a spectrum analyzer; 4) plot the waveform of a voltage or current input signal in graphical format; and 5) provides self configuration of its buttons so that the user can customize the display to provide certain information when a certain button is pressed.

The synchronous serial communications bus 38 is also used to communicate with the display 51. Results of all calculations and control functions of the micro-controller 35 can be displayed on the display.

The IED 100 connects to the network 116 through the communications board 48. The microcontroller 35 sends and receives information from a network over the asynchronous serial communications bus 47. In an exemplary embodiment, in the IED 100 the logic or code is implemented in firmware and in the PC the code is implemented in software. It will, of course, be recognized by those skilled in the art that the logic for the IED 100 can also be implemented in software and that the logic in the PC can be implemented in firmware. In the present embodiment, the firmware is implemented using a flash EEPROM 34, such as a 512K byte flash EEPROM available from Intel as part number 28F010 EEPROM. In an exemplary embodiment, the software is written in the C programming language. An exemplary embodiment of the logic for the object oriented architecture of the present invention in object code is given in the microfiche Appendix A provided in the copending application Ser. No. 08/369,849 which is incorporated herein by reference. The object code is presented in Srecord format which is defined in the M68332BUG Debug Monitor User's Manual (Motorola 1990) which is incorporated herein by reference. More detailed schematics for the presently preferred embodiment are given in microfiche Appendix B provided in the copending application Ser. No. 08/369,849 which is incorporated herein by reference.

Figure 4:
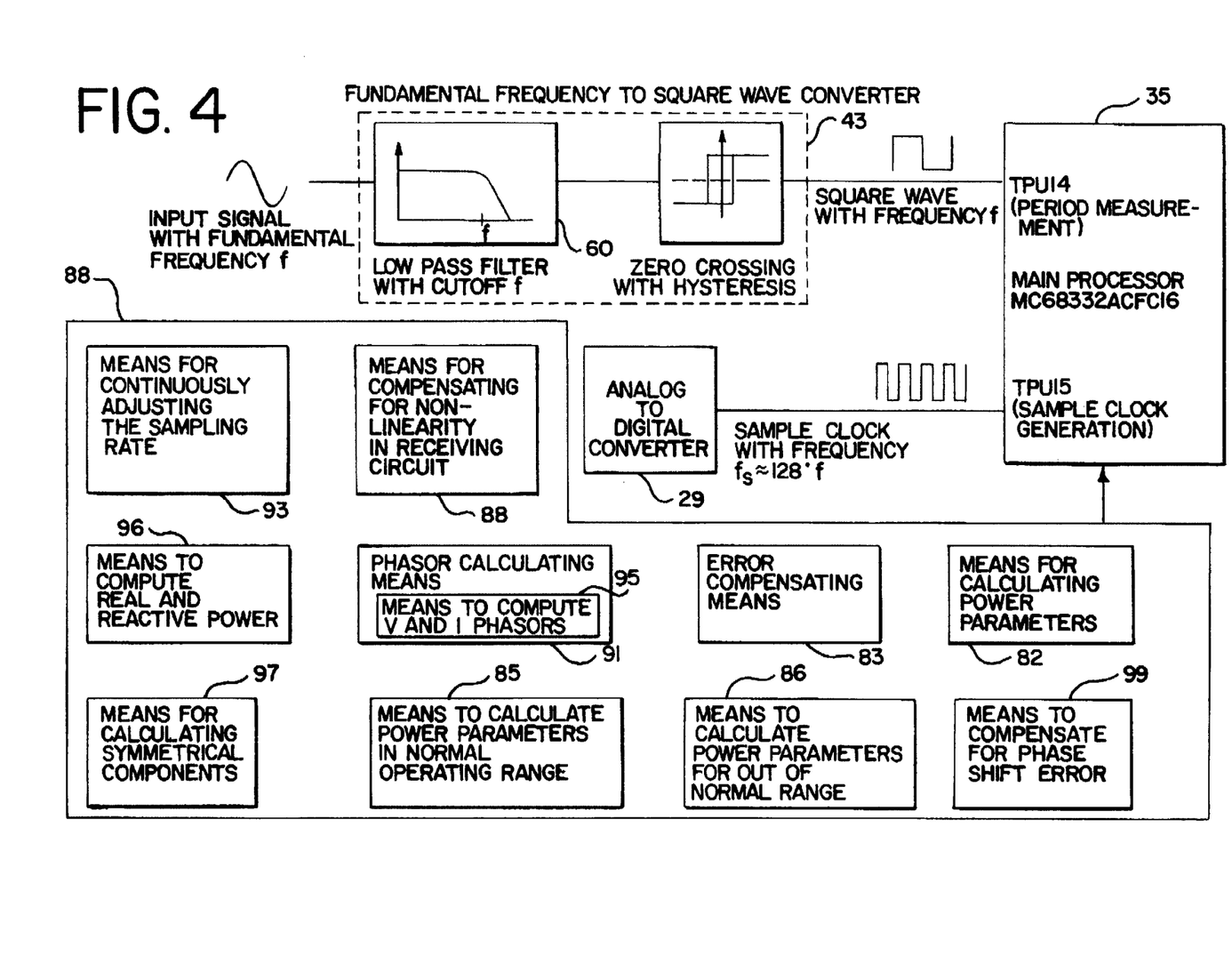
FIG. 4 is a block diagram of an analog interface arrangement for measuring the fundamental frequency of the voltage input signal and generating a sampling clock signal therefrom.

The IED logic stored on the EEPROM 34 is represented by the numeral "88" in FIG. 4. A more detailed description of the preferred embodiment of the present invention and its operation is given in U.S. patent application Ser. No. 08/369,849, now Pat. No. 5,650,936 entitled "Power Monitor Apparatus and Method with Object Oriented Structure" filed concurrently with this application, which is incorporated herein by reference.

Phasor and Symmetrical Components Calculations

In an exemplary embodiment, the present invention samples the 3-phase voltages and currents at 128 samples per cycle. In the exemplary embodiment of the IED 100, the logic 88 includes a phasor calculating means 91 that includes a means 95 to compute voltage and current phasors at each individual harmonic frequency of voltage or current signals such that once a second, the present invention computes the phasors for the first 63 harmonics for each signal by performing a 128-point Fast Fourier Transform (FFT) on one cycle of the sampled waveform.

The following table can be used to illustrate this operation:

| | | |
|---|---|---|
| va[128] | $\xrightarrow{FFT}$ | Va[64] |
| vb[128] | $\xrightarrow{FFT}$ | Vb[64] |
| vc[128] | $\xrightarrow{FFT}$ | Vc[64] |
| ia[128] | $\xrightarrow{FFT}$ | Ia[64] |
| ib[128] | $\xrightarrow{FFT}$ | Ib[64] |
| ic[128] | $\xrightarrow{FFT}$ | Ic[64] | where va[128], vb[128], vc[128], ia[128], ib[128], and ic[128] are the sampled waveforms for the 3-phase voltages and currents and Va[64], Vb[64], Vc[64], Ia[64], Ib[64], and Ic[64] are the FFT results (phasors for the dc component and the first 63 harmonics) of their respective waveforms In addition, in the present invention the IED program logic 88 includes a means 97 for calculating at least one symmetrical component of the voltage and current signals that computes the symmetrical components phasors for the 3-phase voltages and currents for the fundamental signal once a second using the following definitions:

$$V_{zero\ sequence\ phasor} = 1/3(Va[1] + Vb[1] + Vc[1])$$
$$V_{+ve\ sequence\ phasor} = 1/3(Va[1] + aVb[1] + a^2Vc[1])$$
$$V_{-ve\ sequence\ phasor} = 1/3(Va[1] + a^2Vb[1] + aVc[1])$$

$$I_{zero\ sequence\ phasor} = 1/3(Ia[1] + Ib[1] + Ic[1])$$
$$I_{+ve\ sequence\ phasor} = 1/3(Ia[1] + aIb[1] + a^2Ic[1])$$
$$I_{-ve\ sequence\ phasor} = 1/3(Ia[1] + a^2Ib[1] + aIc[1])$$

where the operator a causes a counterclockwise rotation through an angle of 120° and is defined as a=−0.5+j0.866.

Power Calculations

The IED program logic 88 includes a means 96 for computing real and reactive power at each harmonic frequency of the voltage and current signals. The real power at each harmonic frequency is computed by multiplying the magnitude of the voltage phasor at the harmonic frequency times the magnitude of the current phasor at the harmonic frequency times the cosine of the angle between the two phasors. The reactive power at each harmonic frequency is computed by multiplying the magnitude of the voltage phasor at the harmonic frequency times the magnitude of the current phasor at the harmonic frequency times the sine of the angle between the two phasors. These two operations can be accomplished for any harmonic of the fundamental frequency up the Nyquist limit. The same result can be obtained by multiplying the two phasors together which generates a complex pair representing the real and reactive power at the harmonic frequency.

Tail

An important aspect of the present invention is the ability to provide high-accuracy power parameters by calculating these power parameters over an integral number of line signal periods. To achieve this, the power monitor includes IED program logic 88 comprising an error compensating means 83 that is able to precisely determine the exact fundamental frequency of the incoming signals. It is reasonable to assume that the incoming signals V1–V3 and I1–I3 have the same fundamental frequency and that this frequency is stable over the measurement period. It is also reasonable to assume that the incoming signals contain signal components of higher harmonics (frequencies that are integer multiples of the fundamental frequency)because of the nature of the electrical loads connected t6 the power system. The method of searching for zero-crossings in the sampled data to determine the signal's frequency is not reliable and is prone to error in the presence of harmonics. In the present invention, the high frequency components in the signal are eliminated through the use of a low pass filter before attempting to measure the signal's fundamental frequency. Referring to FIG. 4, the fundamental frequency to square wave converter 43 receives the phase A voltage signal as input, feeds the signal through a low pass filter 60 which has a cutoff frequency "f", such as of 75 Hz, and generates a square wave output signal whose frequency exactly matches the fundamental frequency of the input signal. The square wave signal is then coupled into one of the TPU channels (TPU14) of the microcontroller 35 configured to measure the accumulated period of the input signal over 1 second. The result of this measurement is used to calculate the sample clock period using the following equation:

$$SC = \left[ \frac{P_n}{n \times 128} \right] + 1$$

where

SC=sample clock period $P_n$=accumulated period over n cycles measured by TPU14 n=number of cycles

Both SC and $P_n$ are in units of TPU internal clock ticks, and the computation is done using integer arithmetic since fractional clock ticks are not permissible. One of the TPU channels (TPU15) is then programmed to generate a square wave signal with a period of SC which is transmitted to A/D converter 29. This process is repeated every second when power is applied to the power monitoring unit. The sampling clock generated on TPU15 has a frequency of approximately 128 times the fundamental frequency of the input signal. It is important to note that the sampling frequency is, most of the time, not exactly 128 times the fundamental frequency of the input signal because the TPU can only generate a signal whose period is a multiple of the TPU's internal clock tick (which has a finite resolution).

Figure 5:
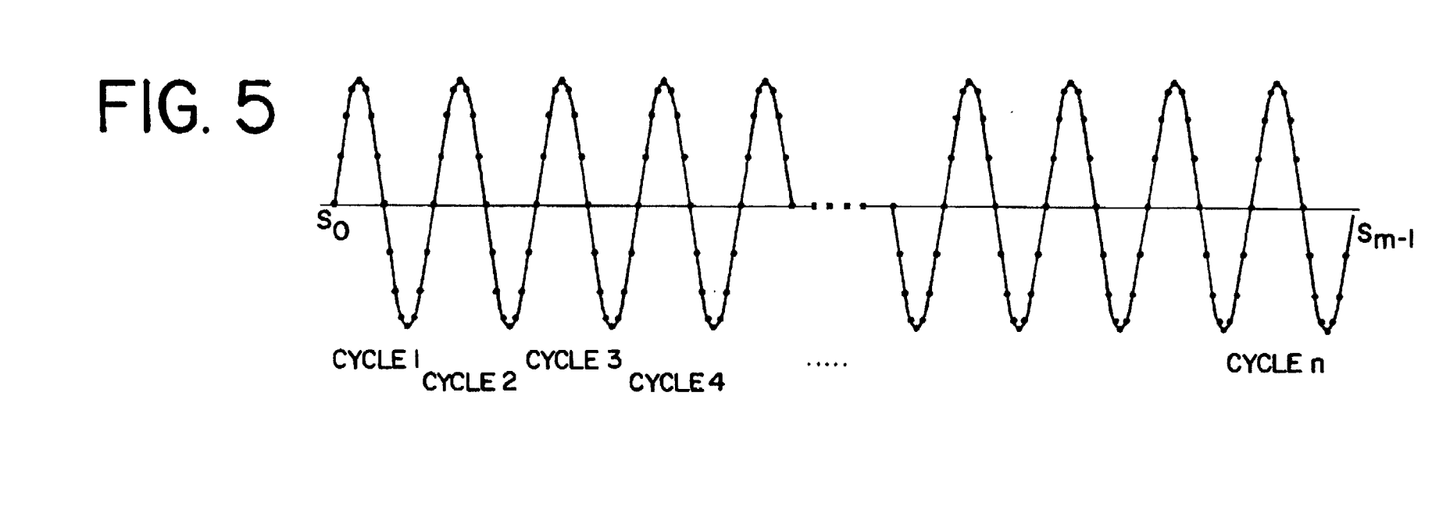
FIG. 5 illustrates the scenario where the sampling frequency is exactly an integral multiple of the signal's fundamental frequency.
Figure 6:
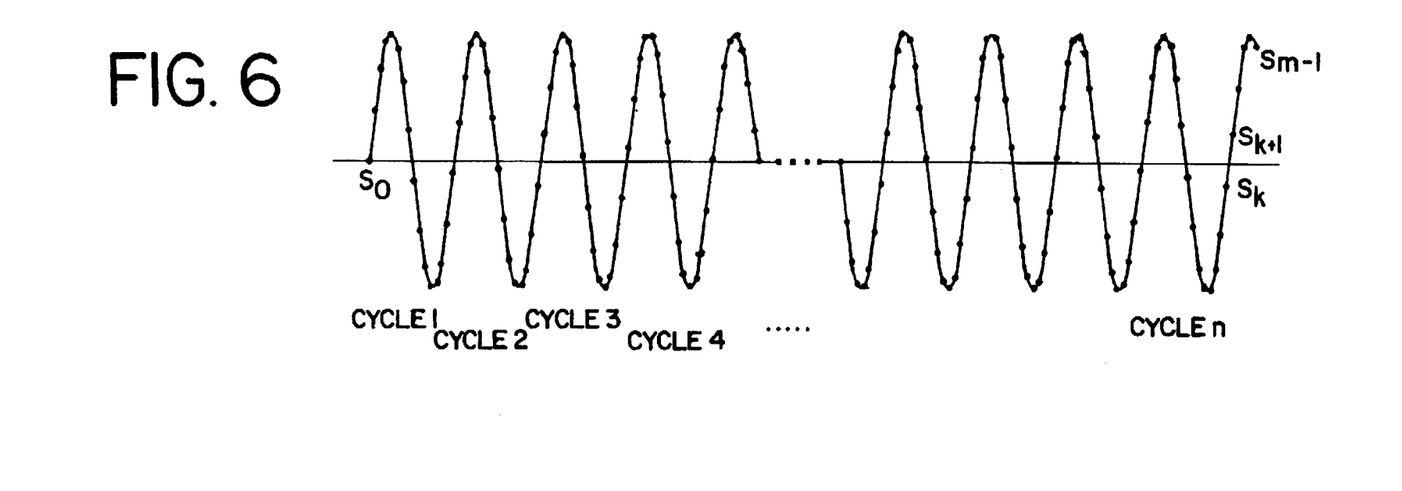
FIG. 6 illustrates the scenario where the sampling frequency is slightly less than an integral multiple of the frequency of the signal's fundamental frequency.

As will be appreciated, the division always truncates because of integer arithmetic. One is added to the result of this division to ensure that SC is always rounded up. This is done to guarantee that at the end of one second, the samples that have been taken will span more than n cycles but less than n+1 cycles. This is illustrated in FIG. 5 and FIG. 6. Assuming that the sampling frequency is 16 times (instead of 128 times) the signal's fundamental frequency, FIG. 5 illustrates the scenario that the sampling frequency is "exactly" 16 times the signal's fundamental frequency, while FIG. 6 illustrates the scenario that the sampling frequency is slightly less than 16 times the signal's fundamental frequency. To ensure that the power parameters are calculated over an integral number of line periods, one must determine the number of samples in excess of n complete cycles(the desired integration period) and not include these samples in the calculations. To achieve this, the IED program logic 88 includes a means 93 for continuously adjusting the sampling rate to be near synchronous with the voltage and current signals and the following equations are used:

$$P_s = SC \times 128 \times n$$

$$x = \text{ROUND} \left( \frac{P_s - P_n}{SC} \right)$$

where $P_s$=actual sampling period over n cycles x=number of excess samples ROUND()=a function that rounds a number to the nearest integer $P_n$=accumulated period over n cycles and the excessive samples over n cycles are represented by sample points $S_{k+1}$ to $S_{m-1}$ in FIG. 6.

Multi-Point Calibration

Non-linear transfer characteristics of the detector and sampling means can be compensated for by the IED program logic 88 including a means 88 for compensating for non-linearity in the receiving circuitry by performing multi-point calibration. This results in a calibration constant that is a function of the input signal. The function can be written as follows:

| | |
|---|---|
| cal constant = f(I) = | A for I < 1% of full scale<br>B for 1% full scale < I < 50% full scale<br>C for 50% full scale < I < 120% full scale |

For a given input signal I, the calibration constant can be found from f(I) and then applied to the signal. This procedure is shown in the flow chart of FIG. 7.

Phase Shift Compensation

For an AC system where volts V and current I are given by;

$$V = V_p \sin(wt) \qquad (1)$$

$$I = I_p \sin(wt + \theta) \qquad (2)$$

Real (kW) and reactive (kVAR) power are proportional to $V_p * I_p * \cos(\theta)$ and $V_p * I_p * \sin(\theta)$ respectively, where $\theta$ is the phase angle between the voltage and the current. The phase angle $\beta$ as measured by the meter is the sum of the actual angle $\theta$ between the voltage and current plus an additional phase shift $\theta$ introduced by the detector and sampling means.

$$\beta = \theta + \phi \qquad (3)$$

This additional phase shift $\phi$ will cause an error in the power readings, which must be corrected. To correct for this phase shift it is assumed that the shift introduced by the detector $\phi$ and the sampling means is a function of current I, given by;

$$\phi = f(I) = aI^2 + bI + c \quad (4)$$

The coefficients a,b and c characterize the detector phase shift and are determined at the time of calibration.

By definition the following applies;

$$kVA = (kW^2 + kVAR^2)^{1/2} \quad (5)$$

$$kW = kVA \cos(\theta) \quad (6)$$

$$kVAR = kVA \sin(\theta) \quad (7)$$

Figures 7, 8:
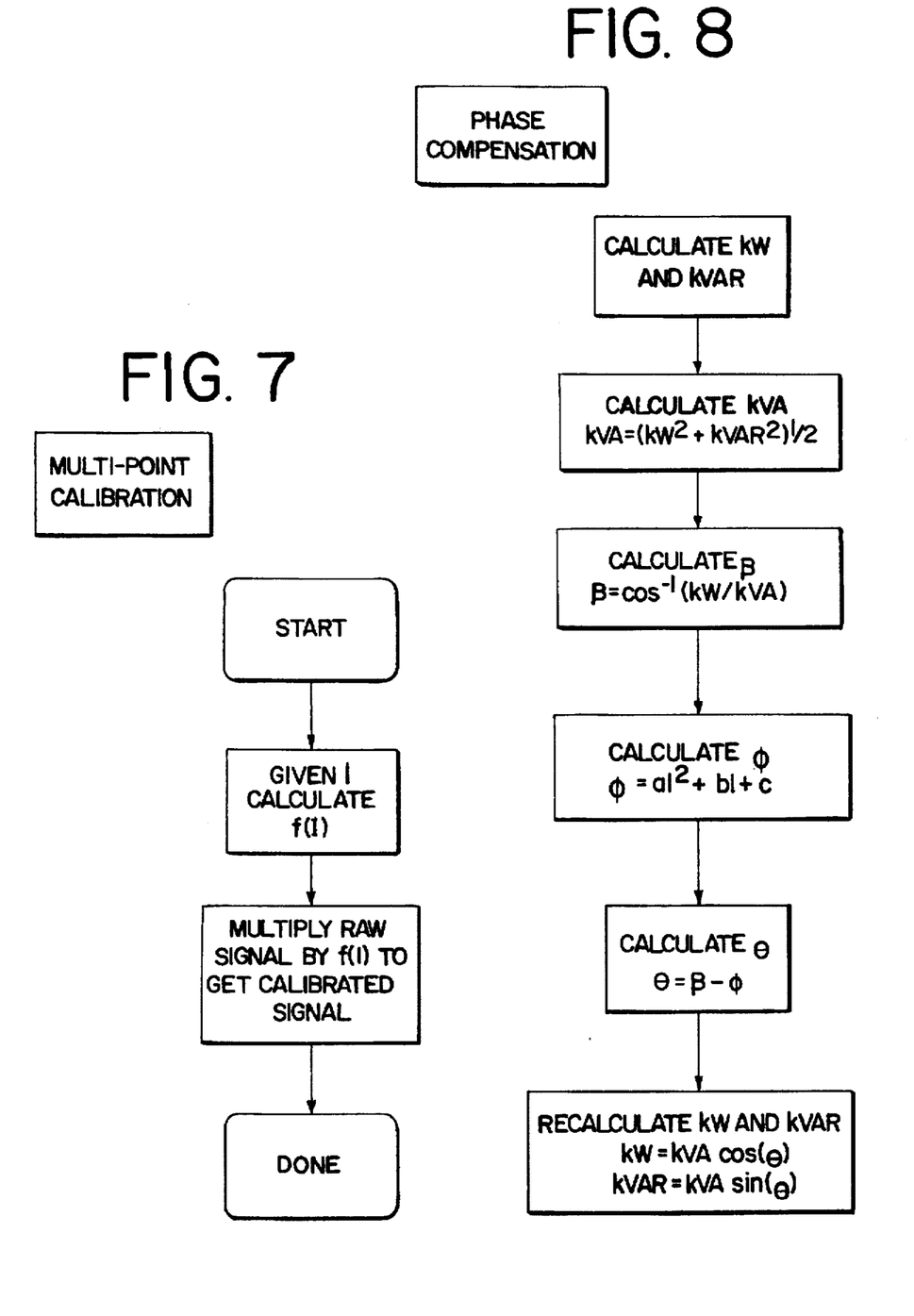
FIG. 7 illustrates a flow chart of the logic for calculating the calibration constant.
FIG. 8 illustrates a flow chart of the logic for calculating the phase shift compensation.

Correction of the power readings for the additional phase shift $\phi$ is done by the IED program logic 88 including a means 99 for compensating for a phase shift error using equations (3)–(7) as shown in FIG. 8.

It is also contemplated that the power meter will including processing means to compute the voltage and current subharmonics.

The foregoing description of the preferred embodiments of the present invention has been presented for purposes of illustration and description. The described embodiments are not intended to be exhaustive or to limit the invention to the precise forms disclosed. Obviously many modifications and variations are possible in light of the above teachings. The embodiments which were described were chosen in order to best explain the principles of the invention and its practical applications. It is intended that the scope of the invention be defined by the following claims, including all equivalents.

We claim:

1. A power meter for determining power parameters for power lines having periodic 3-phase voltage and current signals distributed to a plurality of power equipment, the 3-phase voltage and current signals having a fundamental frequency, the power lines having connected thereto at least one transducer generating analog signals representing the voltage and current signals, the power meter comprising:

receiving circuitry, the receiving circuitry connectable to receive the analog signals from the at least one transducer and generate an output signal therefrom;

an analog to digital converter operatively connected to receive the output signal from the receiving circuitry, sample said output signal at a sampling rate, and convert the voltage and current signals to digital data representing the analog signals; and a processor operatively connected to receive the digital data, the processor including logic means comprising:
    means for calculating the power parameters; and
    means for compensating for errors caused by not sampling synchronous to the fundamental frequency of the signals.

2. The power meter of claim 1 wherein said logic means further comprises:

means for calculating at least one phasor of the voltage and current signals.

3. The power meter of claim 2 wherein said calculating means further comprises:

means to compute the voltage and current phasors at each individual harmonic frequency of the voltage and current signals.

4. The power meter of claim 1 wherein said logic means further comprises:

means to compute real and reactive power at each harmonic frequency of the voltage and current signals.

5. The power meter of claim 1 wherein said logic means further comprises:

means for calculating at least one symmetrical component of the voltage and current signals.

6. The power meter of claim 1 including: conditioning circuitry to receive the voltage and current signals and simultaneously detect signals in a normal operating range and signals in an out of normal operating range; and wherein the logic means further comprises:
    means to calculate power parameters for the signals in the normal operating range.

7. The power meter of claim 6 wherein the logic means further comprises:

means to calculate power parameters for the out of normal range signal.

8. The device of claim 1 wherein said logic means further comprises means for continuously adjusting the sampling rate to be near synchronous with the voltage and current signals.

9. The power meter of claim 1 wherein at least one of the receiving circuitry and the analog to digital converter introduces a phase shift error and wherein said logic means further comprises:

means to compensate for the phase shift error.

10. The power meter of claim 1 wherein said logic means further comprises means for compensating for non-linearity in the receiving circuitry.

11. The power meter of claim 1 including a plugable circuit board including conditioning circuitry receiving said voltage and current signals and a memory containing calibration data such that the plugable circuit boards can be interchanged without loss of power meter accuracy, said conditioning circuitry connected to said receiving circuitry.

12. The power meter of claim 1 including a plugable circuit board including conditioning circuitry receiving said voltage and current signals and a memory containing configuration data such that the processor can detect the circuit configuration and adopt a correct mode of operation, said conditioning circuitry connected to said receiving circuitry.

13. A power meter for determining power parameters for power lines having periodic 3-phase voltage and current signals distributed to a plurality of power equipment, the power lines having connected thereto at least one transducer generating analog signals representing the voltage and current signals, the power meter comprising:

receiving circuitry, the receiving circuitry connectable to receive the analog signals from the at least one transducer and generate an output signal therefrom;

an analog to digital converter operatively connected to receive the output signal from the receiving circuitry, sample the output signal at a sampling rate, and convert the voltage and current signals to digital data representing the analog signals; and a processor operatively connected to receive the digital data, the processor including logic means comprising:
    means for calculating at least one phasor of the voltage and current signals; and
    means for continuously adjusting the sampling rate to be near synchronous with the voltage and current signals.

14. The power meter of claim 13 wherein said calculating means further comprises means to compute the voltage and current phasors at each individual harmonic frequency of the voltage and current signals.

15. The power meter of claim 13 wherein said calculating means further comprises means to compute real and reactive power at each harmonic frequency of the voltage and current signals.

16. The power meter of claim 13 wherein said calculating means further comprises means for calculating at least one symmetrical component of the voltage and current signals.

17. The power meter of claim 13 including: conditioning circuitry to receive the voltage and current signals and simultaneously detect signals in a normal operating range and signals in an out of normal operating range; and wherein the logic means further comprises means to calculate power parameters for the signals in the normal operating range.

18. The power meter of claim 17 wherein the logic means further comprises means to calculate power parameters for the out of normal range signal.

19. The power meter of claim 13 wherein at least one of the receiving circuitry and the analog to digital converter introduces a phase shift error and wherein said logic means further comprises means to compensate for the phase shift error.

20. The power meter of claim 13 wherein said logic means further comprises means for compensating for non-linearity in the receiving circuitry.

21. The power meter of claim 13 including a plugable circuit board including conditioning circuitry receiving said voltage and current signals and a memory containing calibration data such that the plugable circuit boards can be interchanged without loss of power meter accuracy, said conditioning circuitry connected to said receiving circuitry.

22. The power meter of claim 13 including a plugable circuit board including conditioning circuitry receiving input signals and a memory containing configuration data such that the processor can detect the circuit configuration and adopt a correct mode of operation, said conditioning circuitry connected to said receiving circuitry.

* * * * *